US009450596B2

(12) United States Patent
Kim et al.

(10) Patent No.: US 9,450,596 B2
(45) Date of Patent: Sep. 20, 2016

(54) RAMP AND SUCCESSIVE APPROXIMATION REGISTER ANALOG TO DIGITAL CONVERSION METHODS, SYSTEMS AND APPARATUS (75) Inventors: Dongsoo Kim, San Jose, CA (US); Taehee Cho, Palo Alto, CA (US); Isao Takayanagi, Tokyo (JP); Ashirwad Bahukhandi, San Jose, CA (US); Chiajen Lee, Irvine, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 920 days.

(21) Appl. No.: 13/228,502

(22) Filed: Sep. 9, 2011

(65) Prior Publication Data
US 2012/0287316 A1 Nov. 15, 2012

Related U.S. Application Data (60) Provisional application No. 61/483,920, filed on May 9, 2011.

(51) Int. Cl.
| *H03M 1/50* | (2006.01) |
| *H03M 1/12* | (2006.01) |
| *H04N 5/378* | (2011.01) |
| *H03M 1/14* | (2006.01) |
| *H03M 1/46* | (2006.01) |
| *H03M 1/56* | (2006.01) |

(52) U.S. Cl.
CPC ............. *H03M 1/122* (2013.01); *H04N 5/378* (2013.01); *H03M 1/14* (2013.01); *H03M 1/46* (2013.01); *H03M 1/56* (2013.01)

(58) Field of Classification Search
CPC ...... H03M 1/468; H03M 1/12; H03M 1/462; H03M 1/804; H03M 1/002; H03M 1/466; H03M 1/125; H03M 1/00; H03M 1/005; H03M 1/069; H03M 1/34
USPC .................. 341/118, 120, 155, 168, 169, 172
See application file for complete search history.

(56) References Cited

U.S. PATENT DOCUMENTS

| 5,995,033 | A | * | 11/1999 | Roeckner | ................ | H03M 1/02 341/108 |
| 6,198,313 | B1 | * | 3/2001 | Poucher | ................ | G11C 27/02 327/91 |
| 6,844,840 | B1 | * | 1/2005 | Melanson | ............... | H03M 1/46 341/155 |
| 7,456,768 | B2 | * | 11/2008 | La Rue | ............... | H03M 1/1245 341/140 |
| 7,504,977 | B2 | * | 3/2009 | Doorenbos | ........... | H03M 1/145 341/122 |
| 7,567,196 | B2 | | 7/2009 | Boemler | | |
| 8,547,260 | B2 | * | 10/2013 | Sestok | .................... | H03M 7/00 341/122 |
| 2006/0125673 | A1 | * | 6/2006 | Lee | .......................... | H03K 4/50 341/155 |

(Continued)

Primary Examiner — Linh Nguyen
(74) Attorney, Agent, or Firm — Joseph F. Guihan (57) ABSTRACT Successive approximation register (SAR) and ramp analog to digital conversion (ADC) methods, systems, and apparatus are disclosed. An analog voltage signal may be converted into a multiple bit digital value by generating bits of the multiple bit digital value by performing a SAR conversion on the analog voltage signal, where the bits corresponding to a SAR voltage level, and generating other bits of the multiple bit digital value by performing one or more ramp conversions on the analog voltage signal, the ramp conversion comparing the analog voltage signal to a ramp of voltage levels based on the SAR voltage level. The SAR and ramp ADC can provide multi-sampling using one SAR conversion and multiple ramp conversions. The SAR can set the voltage level of a first ramp of a multiple ramp conversion, which can then be used to preset the voltage level prior to subsequent ramps.

7 Claims, 8 Drawing Sheets (56) References Cited

U.S. PATENT DOCUMENTS

| | | | |
|---|---|---|---|
| 2009/0066554 A1* | 3/2009 | Lim | H03M 1/144 341/155 |
| 2009/0212985 A1* | 8/2009 | Kasuga | H04N 5/378 341/156 |
| 2011/0227774 A1* | 9/2011 | Cho | H03M 1/0678 341/172 |
| 2012/0105262 A1* | 5/2012 | Rao | H03M 1/123 341/155 |

* cited by examiner

RAMP AND SUCCESSIVE APPROXIMATION REGISTER ANALOG TO DIGITAL CONVERSION METHODS, SYSTEMS AND APPARATUS

CROSS REFERENCE TO RELATED APPLICATIONS

This application claims priority to U.S. Provisional Application Ser. No. 61/483,920, entitled CMOS IMAGE SENSOR WITH MULTISAMPLING ADC USING SAR (SUCCESSIVE APPROXIMATION REGISTER) AND MULTIPLE RAMP, filed May 9, 2011, the contents of which are incorporated fully herein by reference.

FIELD OF THE INVENTION

Embodiments described herein relate generally to semiconductors and more particularly to analog to digital conversion methods, systems, and apparatus.

BACKGROUND OF THE INVENTION

Figure 1:
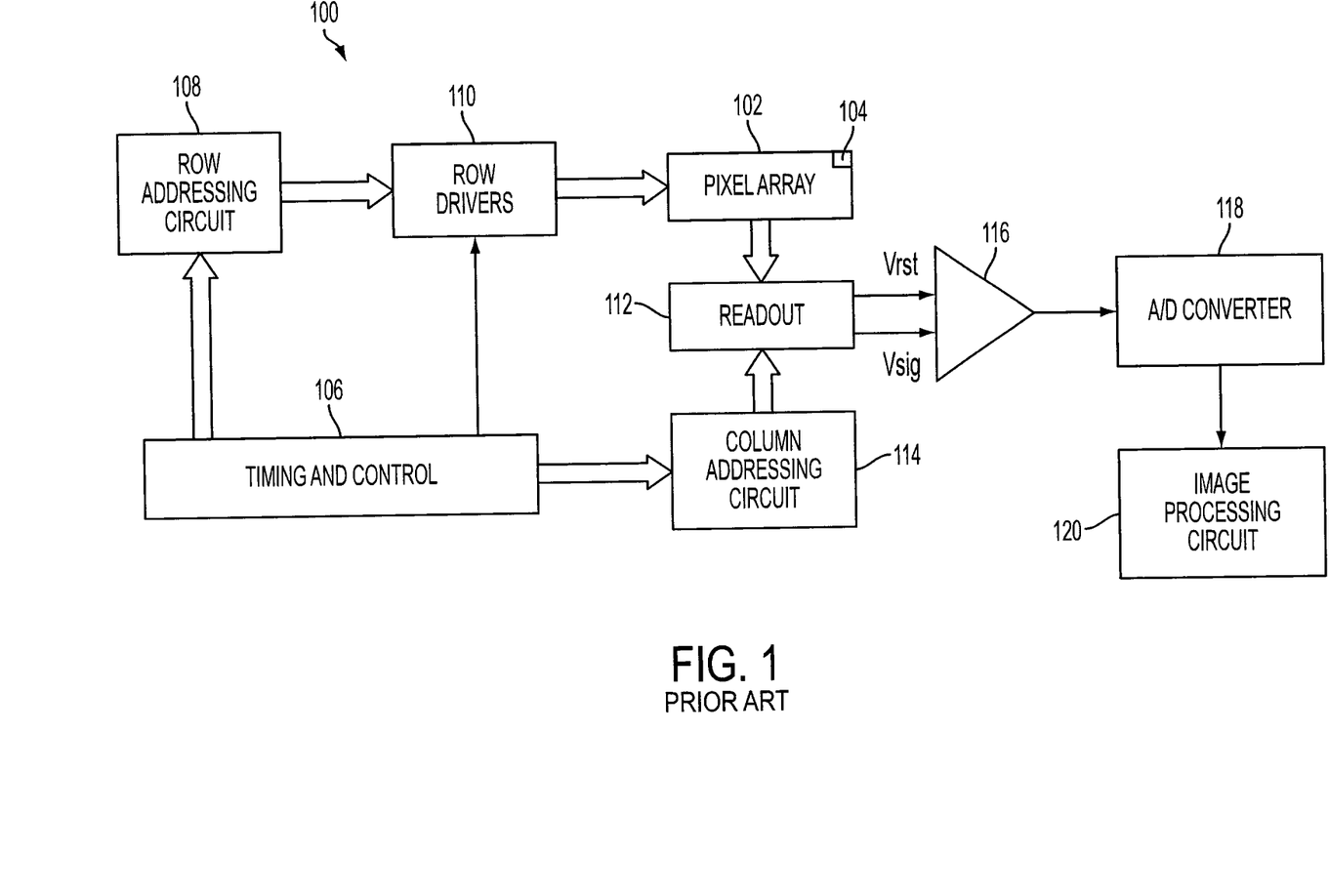
FIG. 1 is a block diagram of a prior art imaging device.

Many portable electronic devices, such as cameras, cellular telephones, Personal Digital Assistants (PDAs), MP3 players, computers, and other devices include a semiconductor (e.g., complementary metal-oxide-semiconductor; CMOS) imaging device for capturing images using an array of pixels. FIG. 1 depicts an imaging device 100 that includes an array 102 of pixels 104 and a timing and control circuit 106. The timing and control circuit 106 provides timing and control signals for enabling the reading out of signals from pixels 104 of the pixel array 102 in a manner commonly known to those skilled in the art. Although one pixel 104 is illustrated, the pixel array 102 has dimensions of Y rows by X columns of pixels 104, with the size of the pixel array 102 depending on the application.

Signals from the imaging device 100 are typically read out a row at a time using a column parallel readout architecture. The timing and control circuit 106 selects a particular row of pixels in the pixel array 102 by controlling the operation of a row addressing circuit 108 and row drivers 110. Signals stored in the selected row of pixels are provided to a readout circuit 112 in the manner described above. The signals are read twice from each of the columns and then read out sequentially or in parallel using a column addressing circuit 114. The pixel signals (Vrst, Vsig) corresponding to a pixel reset signal and an pixel image signal are provided as outputs of the readout circuit 112, and are typically subtracted by a differential amplifier 116 in a correlated double sampling (CDS) operation and the result digitized by an analog to digital converter (ADC) 118 to provide a digital pixel signal represent an image captured by pixel array 102 for processing by an image processing circuit 120.

Figure 2:
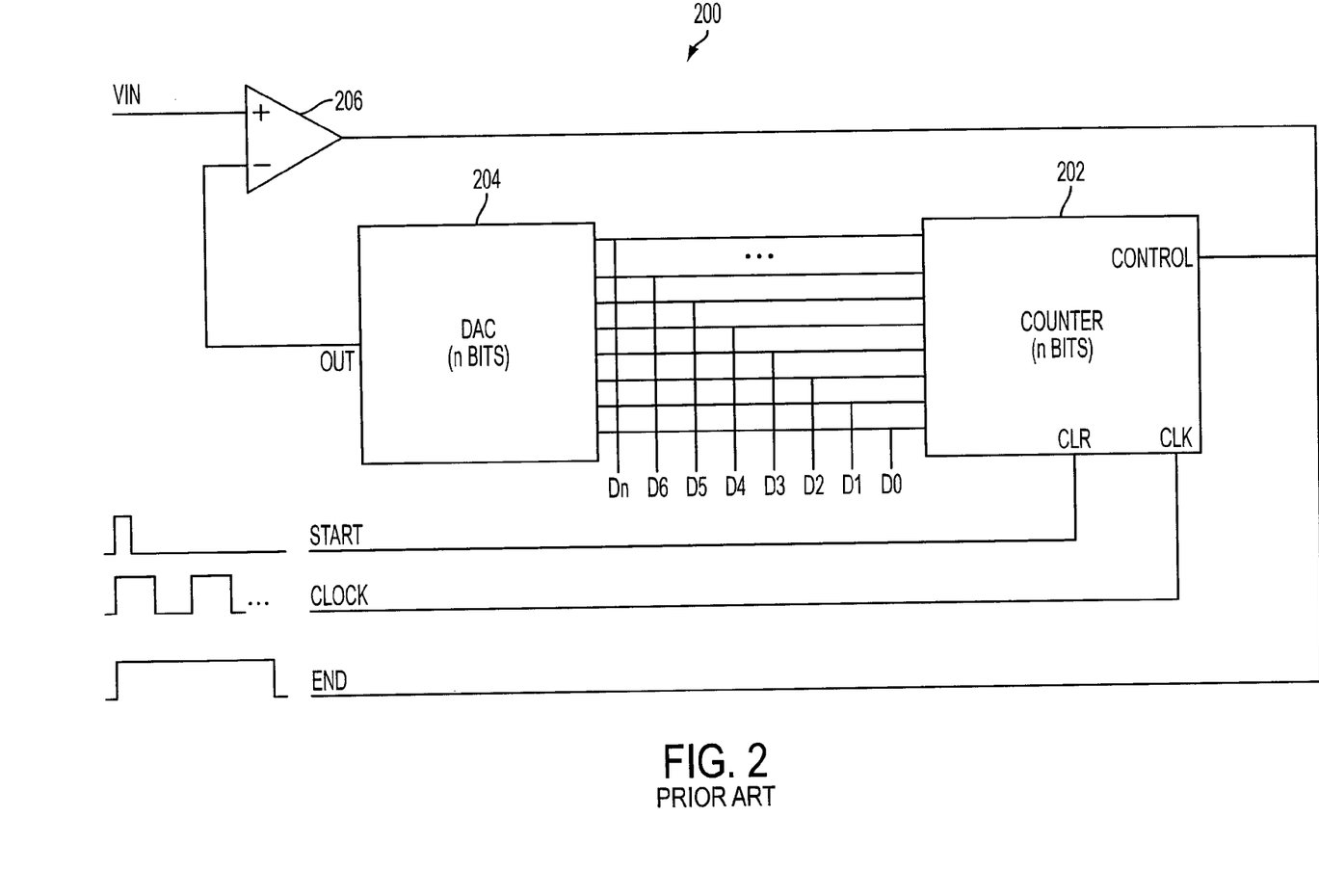
FIG. 2 is a block diagram of a prior art ADC.

Pixel values are read out as tiny voltages, on the order of microvolts per electron. Those voltages are passed to the ADC 118 for conversion into a digital pixel value. FIG. 2 depicts a prior art ADC 200 known as a ramp ADC. Vin is the analog input voltage and Dn through D0 are multiple bit digital outputs (eight output bits are illustrated). A counter 202 starts counting when an analog input voltage is to be converted. The counter supplies a digital counter value to a digital to analog converter 204, which generates a comparison voltage level at a comparator 206. As the counter 202 increases, the comparison voltage incrementally increases for comparison with the analog input voltage. Once the comparison voltage exceeds the analog input voltage, the counter 202 ends with the end value representing the multiple bit digital output of the analog input voltage. An ADC such as ADC utilize up to $2^n-1$ clock cycles to convert each analog voltage sample. Thus, for an 8-bit ADC, it take up to 255 clock cycles to convert a single sample. For a 16-bit ADC it would take up to 65,535 clock cycles to convert one sample.

Figure 3:
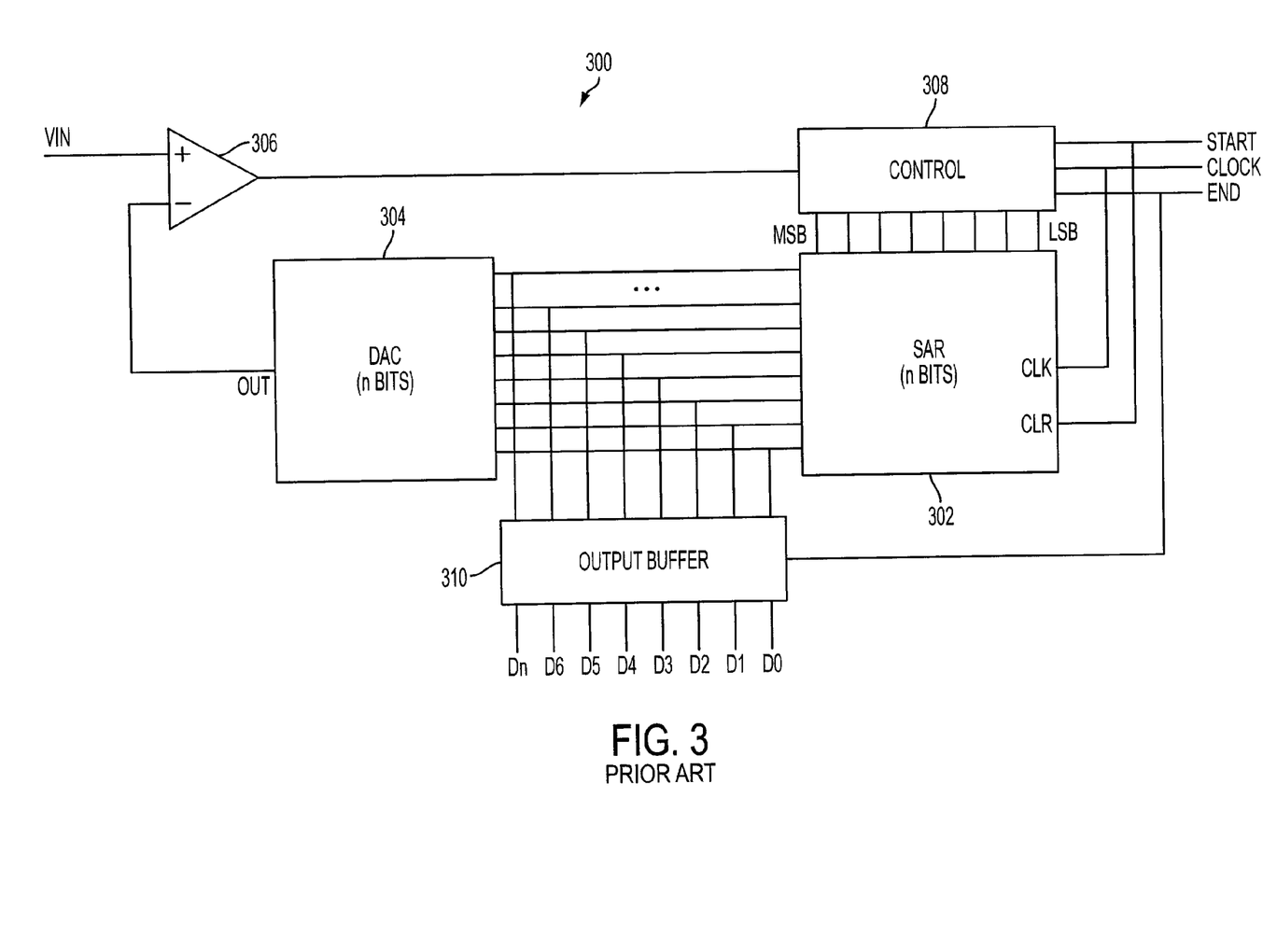
FIG. 3 is a block diagram of another prior art ADC.

FIG. 3 depicts another prior art ADC 300 known as a successive approximation register (SAR) ADC. Vin is the analog input and Dn through D0 are the multiple bit digital outputs. A SAR 302 supplies a digital value to a digital to analog converter 304, which generates a comparison voltage level at a comparator 306. A controller 308 sets the SAR 302 and monitors the comparator 306 to identify the multiple bit digital output one bit at a time from the most significant bit (MSB) to the least significant bit (LSB). A buffer 310 stores each bit of the multiple bit digital output so the digital data remains available while the ADC 300 is processing the next sample of the analog input voltage.

In operation, the SAR 302 initially supplies to the DAC 304 a "1" in the MSB position and "0"s in the remaining positions. If the input voltage is greater than the comparison voltage level, a "1" is stored for the MSB and the ADC 300 proceeds with the MSB and the next MSB set to "1." If the input voltage is less than the comparison voltage level, a "0" is stored for the MSB and the ADC 300 proceeds with the MSB set to "0" and the next MSB set to "1." The ADC 300 proceeds until all bits of the multiple bit digital output are determined. Thus, the ADC 300 is able to find the correct digital value for the analog input voltage in n clock cycles, where n is the number of bits in the multiple bit digital output. For an 8-bit ADC 300, the digital value for each sample can be found in up to eight clock cycles (compared to 255 for ADC 200 (FIG. 2)), and for a 16-bit ADC the digital value for each sample can be found in up to 16 clock cycles (compared to 65,535 for ADC 200 (FIG. 2)).

Noise is an important factor in the design of imaging devices. Noise may result from many of the operations performed during the capture and digitization of an image, both uncorrelated, random noise and periodic noise. Low frequency noise is minimized by CDS, but CDS increases temporal noise. Multisampling is one known technique for reducing low and high frequency noise. Known multisampling techniques, however, are difficult to commercially implement due to frame rate and silicon area limitations.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. The letters "m," "n," "M," "N," "X," and "Y" may represent a non-specific number of elements. Also, lines without arrows connecting components may represent a bi-directional exchange between these components. This emphasizes that according to common practice, the various features of the drawings are not drawn to scale. On the contrary, the dimensions of the various features are arbitrarily expanded or reduced for clarity. Included in the drawings are the following figures.

DETAILED DESCRIPTION OF THE INVENTION

Figure 4:
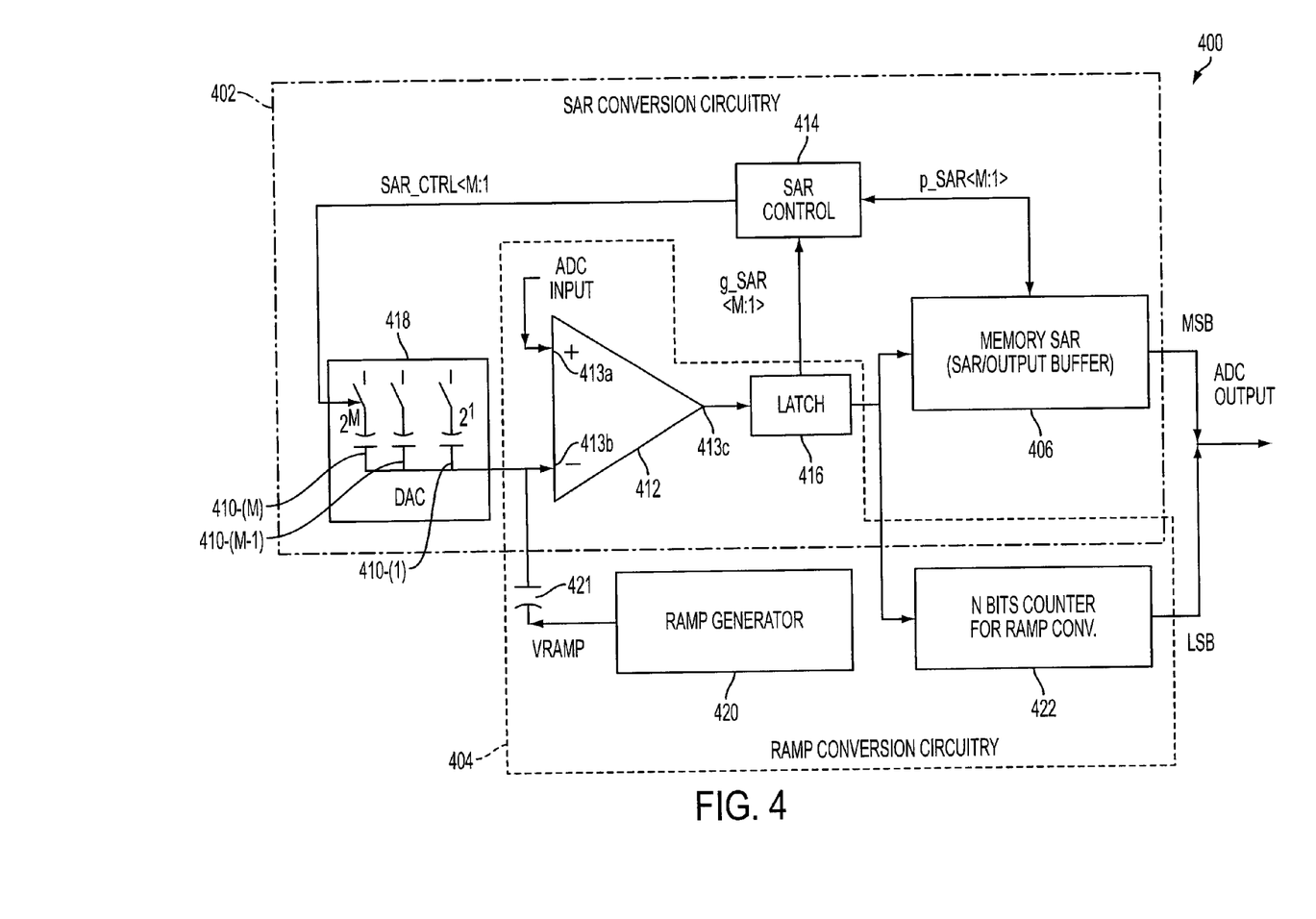
FIG. 4 is a block diagram partially in circuit diagram form of an example ADC in accordance with an aspect of the present invention.

FIG. 4 depicts an ADC 400 that converts an analog voltage signal into a multiple bit digital value in accordance with aspects of the present invention. The ADC 400 includes SAR conversion circuitry 402 and ramp conversion circuitry 404. The multiple bit digital value includes a bit string of several bits with each bit representing a different voltage level. In accordance with typical terminology, the leftmost bit in the bit string is associated with the largest voltage level and is referred to as the most significant bit (MSB), the rightmost bit in the bit stream is associated with the smallest voltage level and is referred to as the least significant bit (LSB), and the bits in between from the LSB to the MSB are associated with incrementally larger voltage levels. In use and as will be described in further detail below, the SAR conversion circuitry 402 generates the most significant bit(s) in the bit stream (including at least the MSB) and the ramp conversion circuitry 404 generates the least significant bit(s) in the bit stream (including at least the LSB). For example, for a 12 bit multiple bit digital value, the SAR conversion circuitry 402 may generate the first 6 bits in the bit stream during a SAR conversion process and the ramp conversion circuitry 404 may generate the last 6 bits in the bit stream during a ramp conversion process.

The SAR conversion circuitry 402 includes a comparator 412 that compares the analog voltage signal (ADC Input) to comparison voltages including a series of reference voltages. The comparator 412 includes an input port 413a that receives the analog voltage signal and another input port 413b that receives the comparison voltages. As described below, the comparison voltages are initially generated by a DAC 408 under control of a SAR control 414 during a SAR conversion process and, then, are generated by a ramp voltage, Vramp, generated by a ramp generator 402 of the ramp conversion circuitry 404 in combination with the DAC 408 under control of a SAR control 414 during a ramp conversion process.

The comparator 412 produces an output signal indicative of the comparison between the analog voltage signal and the comparison voltages at an output port 413c, which is captured by a latch 416. Although the comparator 412 is illustrated as having the analog voltage signal coupled to a positive (+) input port 413a of the comparator 412 and the comparison voltages coupled to a negative (−) input port 413b of the comparator 412, suitable modification to the ADC 400 in order for these inputs 413a, b to be exchanged will be understood by one of skill in the art. The SAR conversion circuitry 402 may be implemented using conventional CMOS fabrication techniques. The comparator 412 may be combined with switched capacitor circuits for auto-zeroing, e.g., to remove offsets and low frequency noise. The design of suitable comparators and latches for use with the present invention (including the use of capacitors and switches within the comparator 412 for offset cancellation) will be understood by one of skill in the art from the description herein.

The SAR conversion circuitry 402 additionally includes a SAR and an associated memory. In the illustrated embodiment, the memory is incorporated into the SAR to create a memory SAR 406 that functions as a SAR and an output buffer of a conventional SAR ADC. The memory SAR 406 is configured to store bits of the multiple bit digital value in the memory as the bits are determined by the SAR conversion circuitry 402 during the SAR conversion process. Additionally, the SAR control 414 may retrieve the stored bits from the memory during the ramp conversion process in order to configure the DAC 418 to produce a SAR voltage level for combination with the ramp voltage. Although illustrated as a single component, it will be understood by one of skill in the art that the SAR and memory of memory SAR 406 may be formed as separate components.

The SAR control 414 is coupled to the output port 413c of the comparator 412 via the latch 416 and is also coupled to the memory SAR 406 and the DAC 418. The SAR control 414 receives information from and controls the memory SAR 406, receives information from the comparator 412 via the latch 416, and sets the DAC 418 to produce the comparison voltage at the input port 413b of the comparator 412 based on information received from the comparator 412 and the memory SAR 406. The SAR controller 414 adjusts the DAC 418 to generate the comparison voltage (SAR comparison voltage) at the input port 413b of the comparator 412 during the SAR conversion process. Additionally, the SAR controller determines a SAR voltage level associated with the at least one bit of the multiple bit digital value being determined using the SAR conversion process, and present the SAR voltage level at the input port 413b of the comparator 412 for use during the ramp conversion process.

The DAC 418, under control of the SAR control 414, produces the SAR comparison voltage during the ramp conversion process and produces the SAR voltage level during the ramp conversion process. The DAC 418 includes at least one switched capacitor circuit 410. Each switched capacitor circuit 410 is associated with a voltage level. The SAR control 414 switches the switched capacitor circuits 410 to generate the desired comparison voltage at the comparator 412. In an embodiment, there is a switched capacitor circuit 410 for each bit of the multiple bit digital output being generated during the SAR conversion process. For example, if M bits of the multiple bit digital value are generated using the SAR conversion circuitry 402, there will be M capacitor circuits 410-(M), 410-(M−1), . . . , 410-1. Thus, if 6 bits are to be determined using the SAR conversion circuitry 402 there would be at least 6 capacitor circuits 410.

The ramp conversion circuitry 404 includes the comparator 412, a ramp generator 420, and a counter 422. The ramp conversion circuitry 404 additionally includes a controller (not shown) which may be implemented within the SAR control 414. The ramp generator 420 is coupled to the input port 413b of the comparator 412 via a capacitor 421 and generates a ramp 454 (FIG. 4A) of voltage level steps during each conversion of a sample of the analog voltage signal. The ramp generator 420 may generate the ramp using conventional techniques such as through the use of a DAC coupled to a counter or the use of an integrator.

Figure 4A:
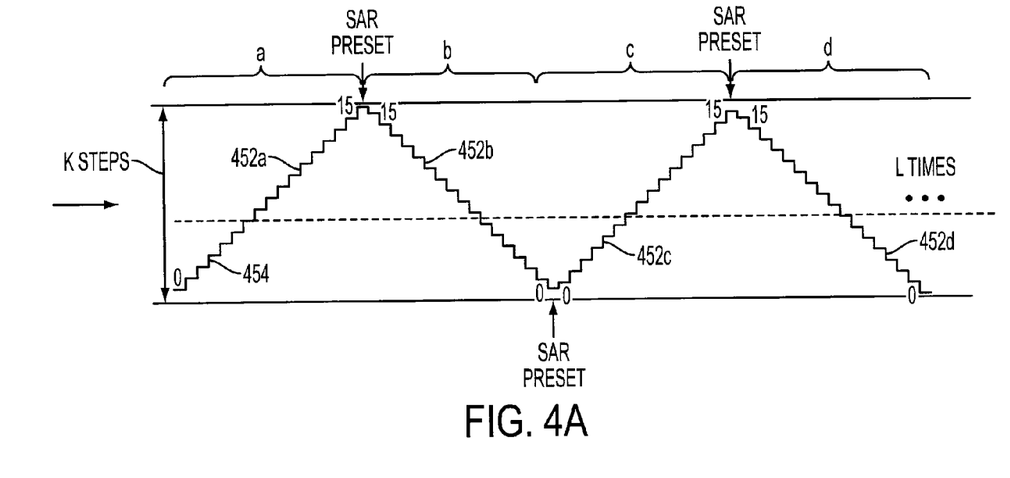
FIG. 4A is a graph of a voltage ramp generated by a ramp generator of the ADC of FIG. 4.

As illustrated in FIG. 4A, the ramp generator 420 may generate a ramp 454 including multiple ramp portions, e.g., to effectively multi-sample the analog input. The multiple ramp portions may include at least one ramp with increasing voltage level steps, such as ramp portions 452a, c, and at least one ramp portion with decreasing voltage level steps, such as ramps 452b, d. In the illustrated embodiment, there are an equal number of increasing voltage level ramp portions and decreasing voltage level ramp portions.

Referring back to FIG. 4, a counter 422 is coupled to the output port 413c of the comparator 412 via the latch 416. The counter 422 is configured to selectively increment during comparison of the analog voltage signal to the comparison voltages generated by the DAC 418 and the ramp generator 420. In one embodiment, in which multiple ramp portions that alternate between increasing voltage level steps and decreasing voltage level steps, the counter 422 increments for each step of the increasing voltage level ramp until the voltage level of the analog voltage signal exceeds the comparison voltage during the ramp conversion process generated by the DAC 418 and the current step of the ramp. The counter 422 then begins incrementing again for each step of a decreasing voltage level ramp once the voltage level of the analog voltage signal exceeds the comparison voltage during the ramp conversion process generated by the DAC 418 and the current step of the ramp.

The process is repeated until the desired number of ramp portions have been applied. In an embodiment, the counter 422 includes a bit for each bit of the multiple bit digital output generated using the ramp conversion circuitry. The number of bits, N, may be determined as $N=\log_2 K+\log_2 L$, wherein K is the number of steps in each ramp and L is the number of ramps. For example, if there are 4 ramps and each ramp has 16 steps (e.g, 0-15), then N would be 6. It will be understood by one of skill in the art from the description herein that the counted value as described herein represents the average value of the analog voltage signal (less the SAR voltage level) being converted.

Figure 4B:
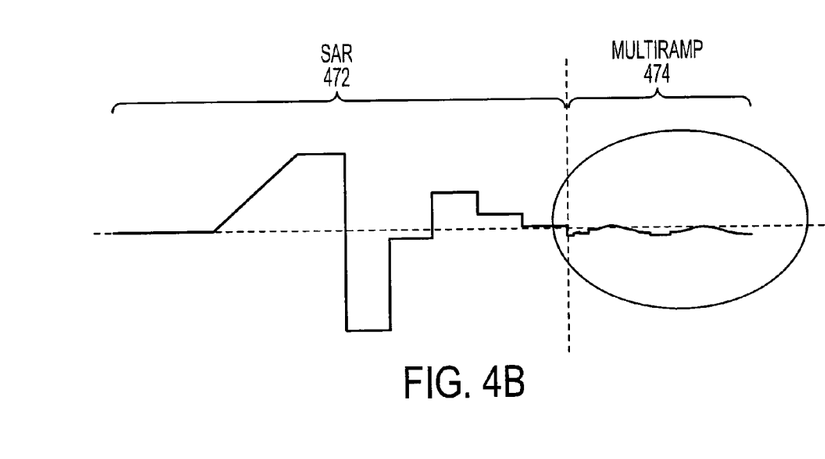
FIG. 4B is an illustration of the voltage values generated by the SAR conversion circuitry and the ramp conversion circuitry of the ADC of FIG. 4.

FIG. 4B depicts a graph 470 illustrating the voltages being generated by the SAR conversion circuitry 402 and by the ramp conversion circuitry 404. The SAR conversion circuitry 402 produces the SAR comparison voltages illustrated in a first portion 472 of the graph 470 and the ramp conversion circuitry 404 produces the ramp voltages illustrated in the second portion of the graph. As illustrated, the SAR conversion circuitry 402 produces relatively large voltage levels when compared to the voltage levels produced by the ramp conversion circuitry 404. This enables relatively course voltage determinations to be made during the SAR conversion process that can be refined during the ramp conversion process. Additionally, the use of multiple ramp portions by the ramp conversion circuitry effectively implements multisampling during the refinement to reduce noise introduced during the amplification and conversion of analog voltage signal samples.

Figure 5:
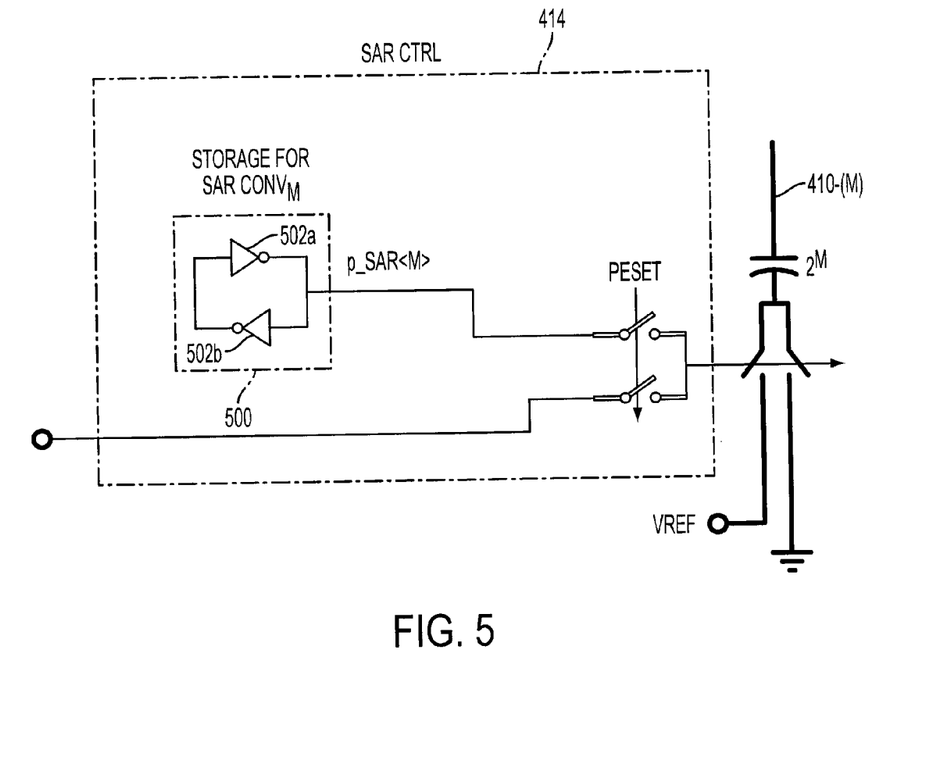
FIG. 5 is a block diagram partially in circuit diagram form of an alternative example SAR Control for use in the ADC of FIG. 4.

FIG. 5 depicts an alternative embodiment of a portion of the SAR control 414. In this embodiment, a storage device 500 is incorporated into the SAR control 414 to store SAR bit levels from the SAR memory for configuring the DAC 418. Once stored in storage device 500, the stored values can be quickly retrieved for configuring the DAC 418 when needed. The storage device 500 may include circuitry for each bit of the multiple bit value determined using the SAR conversion circuitry 402. For example, a value stored in each bit of the illustrated storage device 500 may be used to set a respective capacitor in the illustrated switched capacitor circuit 410-(M). Each bit of the storage device 500 may be implemented with a pair of CMOS inverters 502a, 502b connected in a ring. Additional details regarding SAR ADCs can be found in U.S. Pat. No. 7,567,196 to Christian Boemler, entitled Method of Controlling Digital-to-Analog Conversion, the contents of which are incorporated fully herein by reference.

In an embodiment, the ADC 400 may be used in an imaging system such as a camera including a pixel array of active pixels where each pixel produces an analog voltage image signal. The ADC 400 may be coupled to the active pixel to produce a multiple bit digital image value from the analog voltage image signal.

Figure 6:
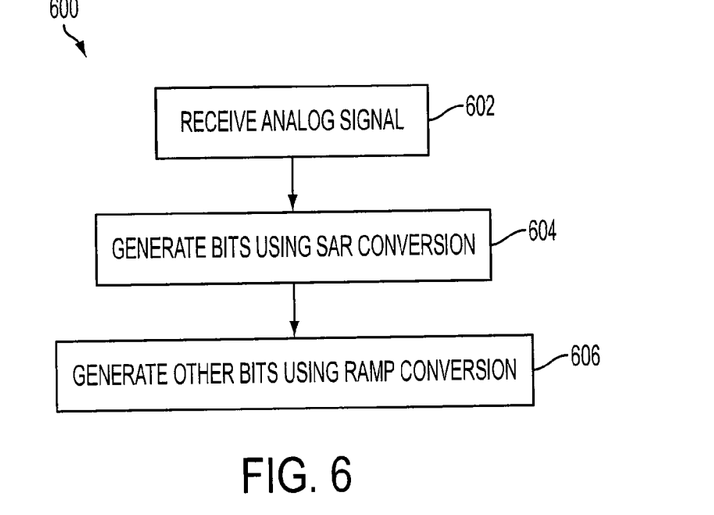
FIG. 6 is a flow chart of an example analog to digital conversion method in accordance with an aspect of the present invention.

FIG. 6 depicts a flow chart 600 of steps for converting an analog voltage signal into a multiple bit digital value in accordance with aspects of the invention. The method will be described with reference to the components illustrated in FIGS. 2, 3, 4, 4A, and 4B to facilitate description. Other suitable components for implementing the method will be understood by one of skill in the art from the description herein.

At step 602, an analog voltage signal is received. The analog voltage signal may be received from an active pixel within a CMOS pixel array of an imaging system such as a camera.

At step 604, described in further detail below with reference to FIG. 6A, one ore more most significant bits of the multiple bit digital value are generated by performing a successive approximation register (SAR) conversion on the analog voltage signal. In an embodiment, the SAR conversion circuitry 402 compares a sample of the analog voltage signal to comparison voltages (e.g., SAR comparison voltages with one SAR comparison voltage for each bit of the multiple bit digital value being determined using the SAR conversion process) to generate the bits, which corresponds to a SAR voltage level.

At step 606, described in further detail below with reference to FIG. 6B, one or more least significant bits of the multiple bit digital value are generated by performing a ramp conversion on the analog voltage signal. In an embodiment, the ramp conversion circuitry 404 compares the analog voltage signal to at least one ramp of voltage levels that is based on the SAR voltage level, e.g., ramp voltage levels are added to the SAR voltage level to produce the comparison voltages.

Figure 6A:
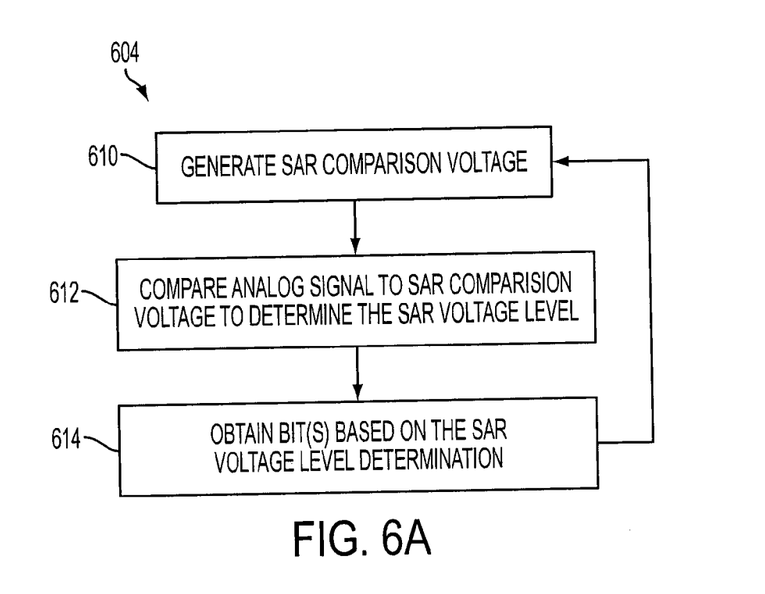
FIG. 6A is a flow chart for generating bits of a digital value using SAR conversion for use in the method of FIG. 6.

FIG. 6A depicts a flow chart for performing the SAR generation step 604 (FIG. 6). In an embodiment, the steps of FIG. 6A are performed for each bit of the multiple bit digital value being determined using the SAR conversion circuitry 402, e.g., once to determine the MSB and subsequently to determine successive bits adjacent to the MSB. For example, if the multiple bit digital value is 12 bits and 6 bits are being determined using the SAR conversion circuitry, the steps of FIG. 6A would be performed 6 times.

At step 610, a SAR comparison voltage is generated. In an embodiment, the SAR comparison voltage is associated with one or more bit positions of the multiple bit digital value, e.g., the MSB and adjacent bits. For example, the first time the steps of FIG. 6A are performed the SAR comparison voltage is associated with the MSB position, the second time the steps of FIG. 6A are performed the SAR comparison voltage is associated with the MSB position and the bit positions adjacent the MSB, etc . . . . The SAR comparison voltage may be generated by the DAC 418 under control of the SAR control 414.

At step 612, the analog voltage signal is compared to the generated SAR comparison voltage (e.g., by the SAR conversion circuitry 402) to determine a SAR voltage level. The SAR voltage level is effectively an approximation of the analog voltage signal that will be refined through repeated passes through the SAR conversion process (e.g., six times total if 6 bits are being determined) and, then, using the ramp conversion process.

At step 614, bit(s) are obtained, e.g., by the SAR conversion circuitry 402, based on the SAR voltage level determination. In an embodiment, when obtaining the MSB, the MSB position is set to "1" if the analog voltage signal is greater than the SAR comparison voltage and the MSB position is set to "0" if the analog voltage signal is less than the SAR comparison voltage. When obtaining subsequent bit positions, the bit position being determined is set to "1" if the analog voltage signal is greater than the SAR comparison voltage and the bit position being determined is set to "0" if the analog voltage signal is less than the SAR comparison voltage. The set bit positions may be stored by SAR control 414 in the memory SAR 406, e.g., for retrieval and use during subsequent passes through the SAR conversion process and for use during the ramp conversion process. If additional bit positions of the multiple bit digital value are to be determined using the SAR conversion process, processing proceeds at step 610 with the generation of a more refined comparison voltage. Otherwise, ramp conversion may be performed to determine the remaining bits of the multiple bit digital value.

Figure 6B:
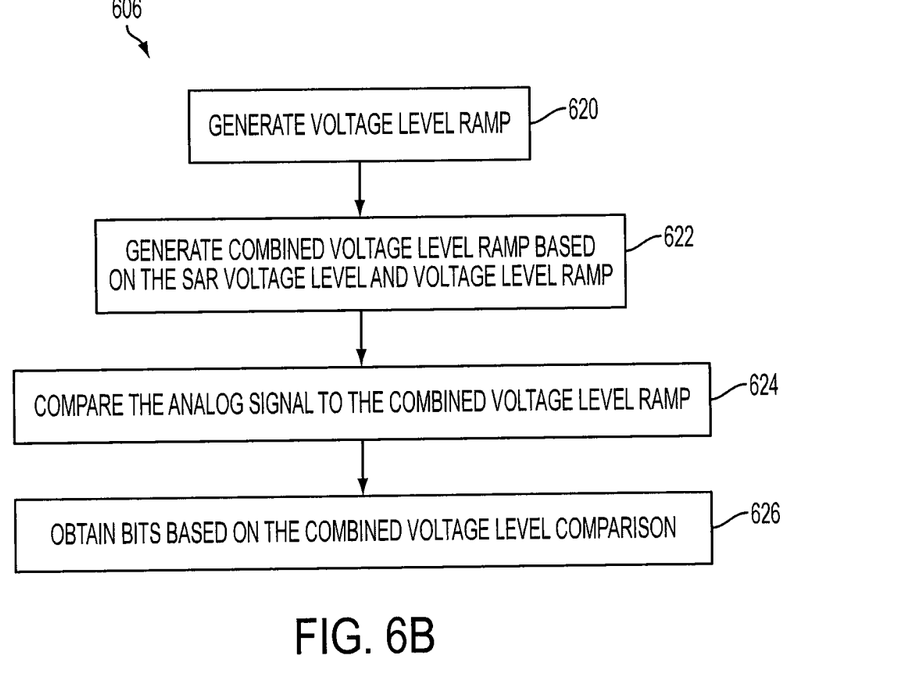
FIG. 6B is a flow chart for generating bits of a digital value using ramp conversion for use in the method of FIG. 6.

FIG. 6B depicts a flow chart for performing the ramp conversion step 606. In an embodiment, the ramp conversion process is performed to determine the remaining bits (i.e., one or more least significant bits) of the multiple bit digital value after the SAR conversion process. For example, if the multiple bit digital value is 12 bits and 6 bits are determined using the SAR conversion circuitry, the remaining 6 bits would be determined using the steps of FIG. 6B.

At step 620, a voltage level ramp is generated such as voltage level ramp 454 (FIG. 4A). The voltage level ramp may be generated by ramp generator 420. In an embodiment, during the SAR conversion process, Vramp is set to a zero voltage level by ramp generator 420.

At step 622, a combined voltage level ramp is generated based on the SAR voltage level determined in steps 610-614 (FIG. 6A) and the voltage level ramp generated in step 622. In an embodiment, SAR control 414 reads the bits obtained during the SAR conversion process from memory SAR 406 and sets the DAC 418 based on the determined bits to produce the SAR voltage level, which is combined with Vramp in a known manner to produce the combined voltage level ramp at the input 413b of the comparator 412 for comparison to the sample of the analog voltage signal. In an embodiment, the SAR control 414 may set the SAR voltage level as produced by the SAR conversion circuitry 402 prior to the first ramp portion within ramp 454, which is then stored. Thereafter, the stored SAR voltage level may be used as a SAR preset at block 628 to preset the SAR voltage level prior to subsequent ramp portions.

In one embodiment, the SAR control 414 reads the bits obtained during the SAR conversion process from memory and sets the DAC 418 prior to each positive and/or negative ramp within ramp 454. In another embodiment, the SAR control 414 reads the bits obtained during the SAR conversion process from memory and sets the DAC 418 prior to the first ramp within ramp 454, but not for subsequent ramps, to improve processing speed.

At step 624, the analog voltage signal is compared to the combined voltage level ramp, e.g., by comparator 412.

At step 626, one or more least significant bits of the multiple bit digital value are obtained based on the comparison of the analog voltage signal to the combined voltage level.

Figure 6C:
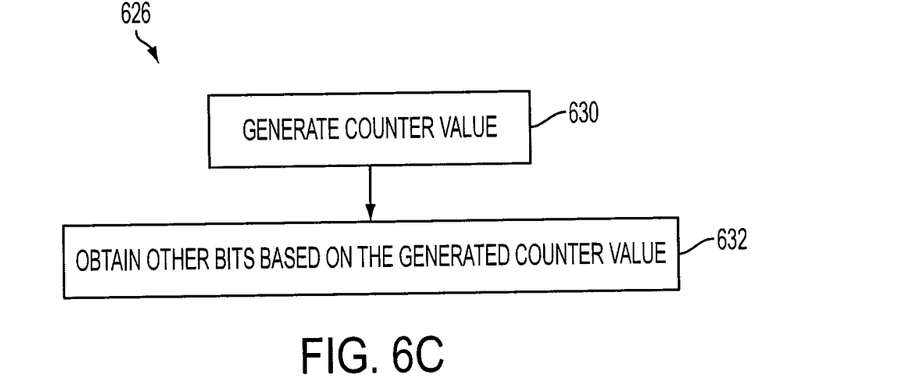
FIG. 6C is a flow chart for obtaining bits based on a counter for use in the method of FIG. 6B.

FIG. 6C depicts a flow chart of steps for obtaining the least significant bits (step 626 of FIG. 6B). At step 630, a counter value is generated, e.g., by counter 422. Counter 422 may generate a counter value by selectively incrementing a counter output value.

If ramp 454 includes a single increasing voltage level ramp, e.g., ramp 452a, the counter value of the counter 422 may increment for each step of the increasing voltage level ramp until the analog input is greater than the combined voltage level ramp. If ramp 454 includes a single decreasing voltage level ramp, e.g., ramp 452b, the counter value of the counter 422 may increment for each step of the decreasing voltage level ramp after the analog input is greater than the combined voltage level ramp. If the ramp 454 includes at least one increasing voltage level ramp and at least one decreasing voltage level ramp, the counter value of the counter 422 may increment for each step of the increasing voltage level ramp(s) until the analog input is greater than the combined voltage level ramp and for each step of the decreasing voltage level ramp(s) after the analog input is greater than the combined voltage level ramp.

At step 632, the least significant bits are obtained based on the generated counter value. In one embodiment, the least significant bits are the generated counter value. In accordance with this embodiment, the number of least significant bits may be equal to $\log_2 K$ plus $\log_2 L$ in which K is the number of steps in each ramp and L is the number of ramps. For example, if there are 16 steps in each ramp and there are four ramps, there would be 6 other bits determined using the generated counter value. (i.e., 4+2=6). Thus, this process yields additional bits (i.e., 2 extra bits in the illustrated example) for inclusion in the multiple bit digital value beyond the number of bits of resolution available based on simply the number of steps in each ramp. In another embodiment, the least significant bits are the generated counter value divided by the number of increasing and decreasing voltage level ramps within the ramp 454.

In one embodiment, the voltage level ramp includes at least one increasing voltage level ramp portion and at least one decreasing voltage level ramp portions and the SAR voltage level is set prior to a first of the increasing and decreasing voltage level ramp portions and is reset prior to subsequent ones of the increasing and decreasing voltage level ramp portions. In another embodiment, the SAR voltage level is set prior to a first of the increasing and decreasing voltage level ramp portions, but is not reset prior to subsequent ones of the increasing and decreasing voltage level ramp portions. This results in higher speed operation, but may not be as effective at reducing noise. Additionally, the analog voltage signal may be sampled/resampled prior to each increasing/decreasing voltage level ramp portion for improved noise characteristics or may be sampled prior to only the first voltage level ramp portion for improved speed characteristics.

Although the invention is illustrated and described herein with reference to specific embodiments, the invention is not intended to be limited to the details shown. Rather, various modifications may be made in the details without departing from the invention. For example, it is contemplated that other processes may be employed to determine other bits of the multiple bit digital value. In this case, the MSB and most significant bit(s) described herein will refer to the most significant bits determined using a SAR conversion process and the LSB and least significant bits described herein will refer to the least significant bit(s) determined using a ramp conversion process.

What is claimed:

1. An analog to digital conversion circuit that converts an analog voltage signal into a multiple bit digital value representing the analog voltage signal, the circuit comprising:

successive approximation register (SAR) conversion circuitry including a comparator configured to receive the analog voltage signal, wherein the comparator includes an input for receiving the analog voltage signal, at least one other input, and at least one output, the SAR conversion circuitry generating a first subset of bits of the multiple bit digital value representing the analog voltage signal; and ramp conversion circuitry including the comparator, the ramp conversion circuitry generating a second subset of bits of the multiple bit digital value representing the analog voltage signal, wherein the second subset of bits is different than the first subset of bits, and wherein the SAR conversion circuitry further comprises:

a SAR coupled to the at least one output of the comparator;

a memory associated with the SAR, the SAR configured to store the at least one bit of the multiple bit digital value in the memory;

a digital to analog converter (DAC) coupled to the at least one other input of the comparator; and a SAR controller, wherein the SAR controller includes a first input coupled to the output of the comparator, a second input coupled to the SAR, and an output coupled to the DAC, wherein the SAR controller is configured to adjust the DAC to generate a SAR comparison voltage level at the at least one other input of the comparator, determine a SAR voltage level associated with the bits, and present the SAR voltage level at the at least one other input of the comparator for use by the ramp conversion circuitry.

2. The circuit of claim 1, wherein a most significant bit (MSB) of the multiple bit digital value is generated using the SAR conversion circuitry and a least significant bit (LSB) of the multiple bit digital value is generated using the ramp conversion circuitry.

3. The circuit of claim 1, wherein the ramp generator is coupled to the at least one other input, and wherein the ramp conversion circuitry further comprises:

a counter coupled to the output of the comparator, the counter configured to store the at least one other bit.

4. The circuit of claim 1, wherein the SAR controller comprises a storage device.

5. The circuit of claim 1, wherein the comparator includes switched capacitor circuits for auto-zeroing.

6. An imaging system comprising:

an active pixel sensor that produces an analog image signal;

a circuit in accordance with claim 1 coupled to the active pixel sensor to produce a digital image value from the analog image signal.

7. The imaging system of claim 6, wherein the imaging system is a camera.

* * * * *